(12) United States Patent  
Bez

(10) Patent No.: US 8,212,565 B2  
(45) Date of Patent: Jul. 3, 2012

(54) NMR MAS ROTOR ASSEMBLY WITH POROUS CERAMIC BEARINGS

(75) Inventor: Eckhard Bez, Littleton, MA (US)

(73) Assignee: Bruker Biospin Corporation, Billerica, MA (US)

( * ) Notice: Subject to any disclaimer, the term of this patent is extended or adjusted under 35 U.S.C. 154(b) by 238 days.

(21) Appl. No.: 12/608,334

(22) Filed: Oct. 29, 2009

(65) Prior Publication Data

US 2011/0101981 A1    May 5, 2011

(51) Int. Cl.
*G01V 3/00*    (2006.01)

(52) U.S. Cl. .......................... 324/318; 324/321

(58) Field of Classification Search .......... 324/300–322  
See application file for complete search history.

(56) References Cited

U.S. PATENT DOCUMENTS

| | | | |
|---|---|---|---|
| 4,446,430 A | 5/1984 | Stejskal | |
| 5,325,059 A * | 6/1994 | Doty | 324/321 |
| 6,695,479 B2 | 2/2004 | Pohn et al. | |
| 6,933,722 B2 * | 8/2005 | Tsuda et al. | 324/318 |
| 7,081,753 B2 * | 7/2006 | Mullen et al. | 324/318 |
| 7,170,292 B2 | 1/2007 | Doty et al. | |
| 7,436,181 B2 * | 10/2008 | Krahn et al. | 324/321 |
| 7,541,807 B2 | 6/2009 | Stringer | |
| 7,915,893 B2 * | 3/2011 | Shevgoor et al. | 324/318 |
| 2006/0017428 A1 * | 1/2006 | Lin et al. | 324/76.19 |

OTHER PUBLICATIONS

Uhlmann, et al., "Air Bearings Based on Porous Ceramic Composites", Technische Universitat Berlin, IWF, Pascalst. 8-9, 10587 Berlin, Germany.

* cited by examiner

*Primary Examiner* — Brij Shrivastav  
(74) *Attorney, Agent, or Firm* — Law Offices of Paul E. Kudirka

(57) ABSTRACT

Each NMR rotor bearing in an NMR magic angle spinning assembly is constructed of a porous ceramic material and has no inlet channels or nozzles. Instead, pressurized gas is forced through pores in the bearing ceramic material from an annular groove at the bearing periphery to the central aperture. Since the pores are small and very numerous, the gas pressure is effectively balanced around the periphery of the central aperture. In addition, if contaminants block one or more pores during operation, the pores are so numerous that the balanced pressure can still be maintained in the central aperture, thereby preventing an imbalance that could destroy the rotor.

6 Claims, 2 Drawing Sheets

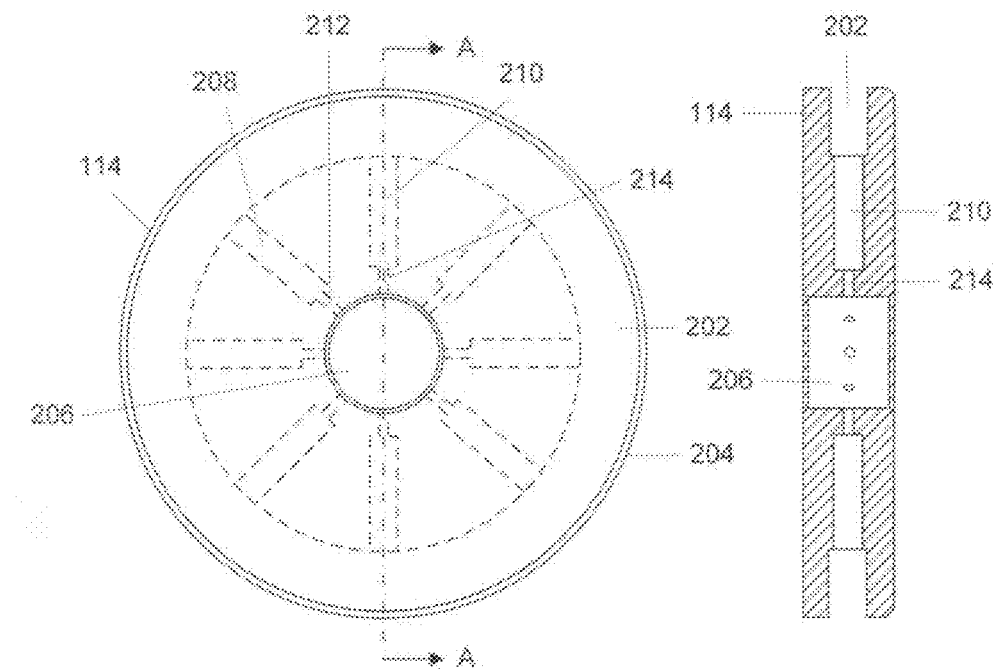
*FIG. 2A* (Prior Art)    *FIG. 2B* (Prior Art)
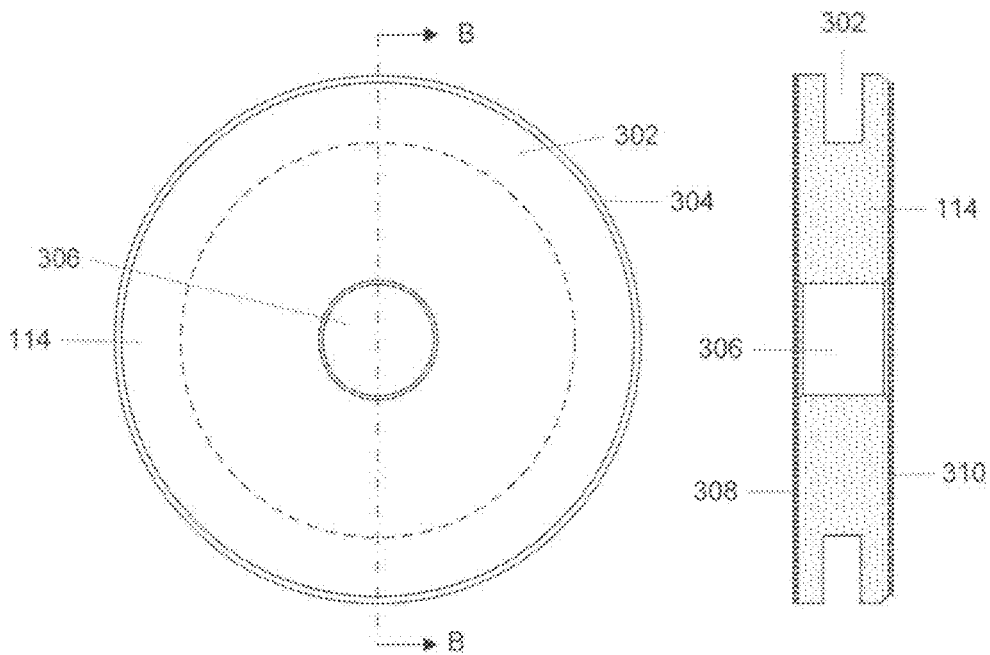
*FIG. 3A*    *FIG. 3B*

NMR MAS ROTOR ASSEMBLY WITH POROUS CERAMIC BEARINGS

BACKGROUND

Nuclear magnetic resonance (NMR) is a physical phenomenon involving quantum mechanical magnetic properties of atomic nuclei in the presence of an applied, external magnetic field. NMR phenomena can be observed with an NMR spectrometer and used to study molecular physics, crystalline and non-crystalline materials. In particular, nuclear spin phenomena can be used to generate a spectrum comprised of a pattern of lines representing the various spins and spin interactions.

In solid materials, the nuclear spins experience a great number of interactions that produce very broad and featureless lines. However, the interactions are time-dependent and can be averaged by physically spinning the sample (at high rotation speeds up to 80 kHz) at an inclination of the so-called magic angle) (54.74°) with respect to the direction of the external magnetic field. The averaging causes the normally broad lines become narrower, increasing the resolution for better identification and analysis of the spectrum.

To perform a magic angle spinning (MAS) nuclear magnetic resonance experiment, a sample is typically packed into a rotor that is, in turn, inserted into a stator assembly 100, such as that shown in FIG. 1. The cylindrical rotor 102 is axially symmetric about the axis of rotation 104 and typically fabricated from zirconia, silicon nitride or a polymer, such as poly-methyl-methacrylate or polyoxymethylene. The rotor 100 is sealed with a double or single end cap 106 fabricated from a material such as Kel-F, Vespel, zirconia or boron nitride depending on the application. The rotor 102 is held radially by a plurality of longitudinally spaced bearings 114 and 116 and is held longitudinally by a "Bernoulli" bearing located at one end. In this type of bearing a flat rotor end 108 engages a flat stator surface 110. A gas feed hole 112 through the flat stator surface 110 produces a gas flow in the circular space between the stator 110 and the rotor surface 108 which flow, in turn, produces a Bernoulli effect that results in a stable axial bearing position. The rotor is rotated by a compressed gas turbine system. In this system, a compressed gas introduced via orifice 118 expands and impinges on turbine blades 120 which are part of, or attached to, end cap 106.

The high rotational speed requires rotors to be radially and axially balanced before and during rotation and the rotation must occur without mechanical contact between stationary and rotating surfaces in order to reduce friction and prevent wear. Oil or liquids cannot be used in the spaces 122 and 124 between the rotor 102 and the radial bearings 114 and 116 because sufficient friction is created by the liquid to interfere with the rotation. Consequently, pressurized gas is normally introduced into these spaces in order to keep the outer walls of rotor 102 enveloped by a layer of gas before and during rotation.

The pressurized gas is introduced into the spaces between the rotor 102 and the bearings 114 and 116 by internal orifices in the bearings. These orifices are shown in more detail in FIGS. 2A and 2B which respectively show a front view of radial bearing 114 and a corresponding cross-sectional view taken along section line A-A of FIG. 2A. Bearing 114 has an annular groove 202 in its outer periphery 204 into which pressurized gas is introduced. The gas enters a plurality of inlet channels, for example, channels 208 and 210. In FIG. 2A, eight channels are shown symmetrically arranged around the central aperture 206 into which the rotor is inserted. Each inlet channel has, at its inner end, a nozzle that injects pressurized gas into the central aperture 206. For example, inlet channels 208 and 210 have nozzles 212 and 214, respectively. The eight nozzles provide a uniform gas layer with balanced pressure between the bearing and the rotor. Other designs may have more or less nozzles.

Orifice bearings of the type shown in FIGS. 2A and 2B fabricated from ceramic materials are conventionally used for NMR MAS stator assemblies. The ceramic material possesses an inherent hardness and stability over a wide temperature range that is generally adequate for satisfactory operation. However, due to the precise machining required of the hard ceramic material, the bearings are difficult and expensive to produce. In addition, during operation contaminates can block one or more of the nozzles. This situation creates pressure disturbances and disrupts the pressure balance. As a result, the rotor begins to wobble and is eventually destroyed as friction increases.

SUMMARY

In accordance with the principles of the invention, each NMR rotor bearing in an NMR magic angle spinning assembly is constructed of a porous ceramic material and has no inlet channels or nozzles. Instead, pressurized gas is forced through pores in the bearing ceramic material from an annular groove at the bearing periphery to the central aperture. Since the pores are small and very numerous, the gas pressure is effectively balanced around the periphery of the central aperture. In addition, if contaminants block one or more pores during operation, the pores are so numerous that the balanced pressure can still be maintained in the central aperture, thereby preventing an imbalance that could destroy the rotor.

BRIEF DESCRIPTION OF THE DRAWINGS

FIG. 2A is a front view of a conventional NMR MAS rotor bearing that uses discrete gas channels to convey pressurized gas from an annular ring at the bearing outer periphery to a central aperture in which the NMR rotor is located.

FIG. 2B is a cross sectional view of the bearing of FIG. 2A taken along section line A-A in FIG. 2A.

FIG. 3A is a front view of an NMR MAS rotor bearing constructed in accordance with the principles of the invention that uses pores in a porous ceramic material to convey pressurized gas from an annular ring at the bearing outer periphery to a central aperture in which the NMR rotor is located.

FIG. 3B is a cross sectional view of the bearing of FIG. 3A taken along section line B-B in FIG. 3A.

DETAILED DESCRIPTION

Figure 1:
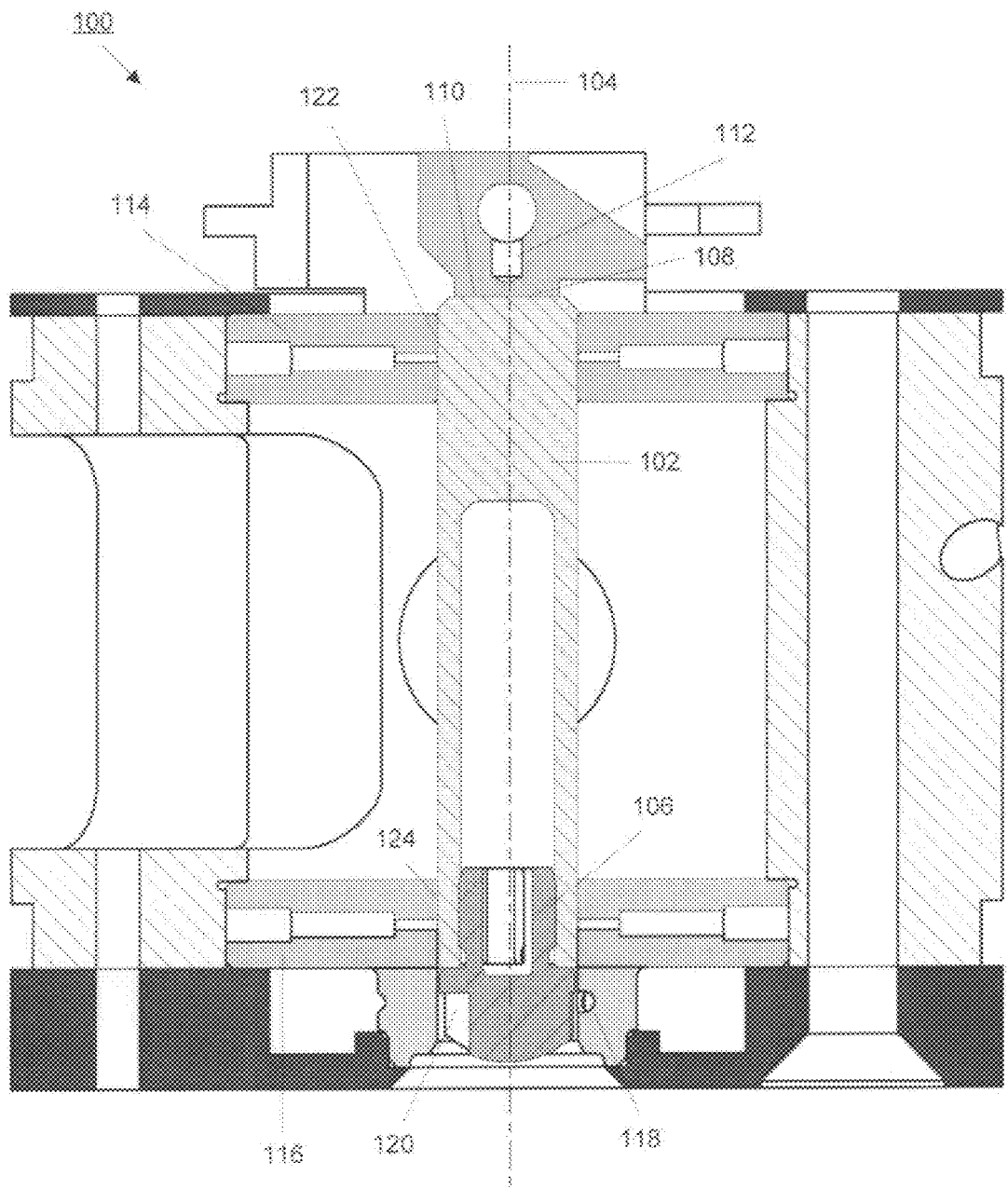
FIG. 1 is a cross-sectional view of a conventional NMR MAS stator assembly.

FIGS. 3A and 3B illustrate an NMR rotor bearing constructed in accordance with the principles of the invention. The bearing is fabricated from a porous ceramic material. For example, a material suitable for use with the invention is aluminum oxide, although any relatively hard material, such as glass frit, could also be used. This material should have very numerous, randomly spaced pores in the 4-25 micron range and these pores substitute for the machined inlet channels and nozzles used in prior art NMR rotor bearings.

In order to prevent gas from escaping through the sides of the bearing, each bearing face is coated with a gas impermeable substance as indicated at 308 and 310. This coating could be any suitable gas impermeable substance, such as an epoxy resin or a polyurethane coating.

When inventive rotor bearings are substituted for prior art rotor bearings 114 and 116 in the conventional stator assembly 100 shown in FIG. 1, pressurized gas applied to annular channel 302, diffuses into the central aperture 306 and provides a gas layer to form the required gas bearing. Porous diffusion provides increased bearing stiffness and load capacity thereby resulting in enhanced axial stability. Further, the porous ceramic bearing is stable over a broad temperature range. Since the material does not require additional machining for drilling orifices, it is more cost effective than prior art designs and requires no maintenance.

While the invention has been shown and described with reference to a number of embodiments thereof, it will be recognized by those skilled in the art that various changes in form and detail may be made herein without departing from the spirit and scope of the invention as defined by the appended claims.

What is claimed is:

1. A nuclear magnetic resonance magic angle spinning assembly, comprising:
    a rotor having a longitudinal axis; and
    a stator assembly having a pair of disk-shaped radial bearings spaced along the longitudinal axis, each bearing having a central aperture into which the rotor fits and an annular channel in its outer periphery and being fabricated from a porous ceramic material so that pressurized gas applied to the annular channel diffuses through pores in the ceramic material to the central aperture and forms a gas bearing between the rotor and the bearing and wherein each bearing has a pair of faces aligned perpendicularly to the longitudinal axis and wherein the assembly further comprises a gas impermeable coating on the faces.

2. The assembly of claim 1 wherein the ceramic material is selected from the group consisting of aluminum oxide and glass frit.

3. The assembly of claim 1 wherein the gas impermeable coating is selected from the group consisting of epoxy resin and polyurethane.

4. In a nuclear magnetic resonance magic angle spinning assembly having a rotor with a longitudinal axis and a stator assembly having a pair of disk-shaped radial bearings spaced along the longitudinal axis, each bearing having a central aperture into which the rotor fits and an annular channel in its outer periphery, the improvement comprising each bearing being fabricated from a porous ceramic material so that pressurized gas applied to the annular channel diffuses through pores in the ceramic material to the central aperture and forms a gas bearing between the rotor and the bearing and wherein each bearing has a pair of faces aligned perpendicularly to the longitudinal axis and wherein the assembly further comprises a gas impermeable coating on the faces.

5. The improvement of claim 4 wherein the ceramic material is selected from the group consisting of aluminum oxide and glass frit.

6. The improvement of claim 4 wherein the gas impermeable coating is selected from the group consisting of epoxy resin and polyurethane.

\* \* \* \* \*